(12) United States Patent
Zhang

(10) Patent No.: US 12,513,889 B2
(45) Date of Patent: Dec. 30, 2025

(54) METHOD OF MANUFACTURING A SEMICONDUCTOR STRUCTURE COMPRISING FORMING AN INSULATING MATERIAL LAYER WITH GAPS THEREIN IN ISOLATION REGION AND MANUFACTURED SEMICONDUCTOR STRUCTURE

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 758 days.

(21) Appl. No.: 17/662,467

(22) Filed: May 9, 2022

(65) Prior Publication Data
US 2023/0225110 A1    Jul. 13, 2023

Related U.S. Application Data

(63) Continuation of application No. PCT/CN2022/081462, filed on Mar. 17, 2022.

(30) Foreign Application Priority Data

Jan. 10, 2022 (CN) .......................... 202210021780.2

(51) Int. Cl.
*H10B 12/00* (2023.01)
*H10D 30/01* (2025.01)
*H10D 30/63* (2025.01)

(52) U.S. Cl.
CPC ....... *H10B 12/315* (2023.02); *H10B 12/0335* (2023.02); *H10B 12/05* (2023.02);
(Continued)

(58) Field of Classification Search
CPC .. H10B 12/315; H10B 12/0335; H10B 12/05; H10B 12/482; H10B 12/033;
(Continued)

(56) References Cited

U.S. PATENT DOCUMENTS 7,713,823 B2    5/2010 Sung et al.
9,349,746 B1    5/2016 Yang et al.
(Continued)

FOREIGN PATENT DOCUMENTS

CN    101425515 A    5/2009
CN    106206442 A    12/2016
(Continued)

OTHER PUBLICATIONS

International Search Report cited in PCT/CN2022/081462 mailed Sep. 23, 2022, 9 pages.

*Primary Examiner* — Davienne N Monbleau
*Assistant Examiner* — John Patrick Cornely
(74) *Attorney, Agent, or Firm* — Syncoda LLC; Feng Ma

(57) ABSTRACT

The present disclosure provides a semiconductor structure and a manufacturing method thereof. The semiconductor structure includes: a base; a plurality of channel pillars perpendicularly provided on the base; a plurality of parallel bit lines, each of the bit lines wrapping lower parts of one column of the channel pillars; and a plurality of parallel word lines, each of the word lines wrapping upper parts of one row of the channel pillars, where the word lines and the bit lines are perpendicular to each other on a same projection plane; an insulating material layer is formed around the channel pillars below the bit lines, between adjacent bit lines, around the channel pillars between the bit lines and the word lines, and between adjacent word lines, separately; and gaps are formed in at least one of the insulating material layers.

17 Claims, 13 Drawing Sheets

(52) U.S. Cl.
CPC ......... *H10B 12/482* (2023.02); *H10D 30/025* (2025.01); *H10D 30/63* (2025.01)

(58) Field of Classification Search
CPC .... H10B 12/488; H10D 30/025; H10D 30/63; H10D 64/252
See application file for complete search history.

(56) References Cited

U.S. PATENT DOCUMENTS

| | | | |
|---|---|---|---|
| 10,134,739 B1* | 11/2018 | Zang | H10D 86/60 |
| 2004/0041188 A1* | 3/2004 | Bissey | H10B 12/053 |
| | | | 257/E29.136 |
| 2011/0121396 A1 | 5/2011 | Lee | |
| 2020/0395362 A1* | 12/2020 | Park | H10B 12/05 |
| 2021/0175236 A1* | 6/2021 | Shih | H10B 12/488 |

FOREIGN PATENT DOCUMENTS

| | | | |
|---|---|---|---|
| CN | 106847754 A | 6/2017 | |
| CN | 108461496 A | 8/2018 | |
| CN | 113594162 A | 11/2021 | |
| CN | 113611671 A | 11/2021 | |

* cited by examiner

METHOD OF MANUFACTURING A SEMICONDUCTOR STRUCTURE COMPRISING FORMING AN INSULATING MATERIAL LAYER WITH GAPS THEREIN IN ISOLATION REGION AND MANUFACTURED SEMICONDUCTOR STRUCTURE

CROSS-REFERENCE TO RELATED APPLICATIONS

This is a continuation of International Application No. PCT/CN2022/081462, filed on Mar. 17, 2022, which claims the priority to Chinese Patent Application 202210021780.2, titled "SEMICONDUCTOR STRUCTURE AND MANUFACTURING METHOD THEREOF" and filed on Jan. 10, 2022. The entire contents of International Application No. PCT/CN2022/081462 and Chinese Patent Application 202210021780.2 are incorporated herein by reference.

TECHNICAL FIELD

The present disclosure relates, but is not limited, to a semiconductor structure and a manufacturing method thereof.

BACKGROUND

In view of hard extension of the storage capacity, the 4F2 structure is provided as a novel method to increase the net modulus and decrease the cell size in the related art. The 4F2 structure can be manufactured with gate all-around (GAA) three-dimensional (3D) transistors. The transistors are perpendicular to the surface of the substrate, and capacitors are electrically connected to upper surfaces of the transistors. From the bottom up, there are bit lines (BLs), dielectric layers, word lines (WLs) and capacitors.

Existing dynamic random access memories (DRAMs) in the related art mainly include a 3×2 buried WL structure, and under the closest packing of the capacitors, areas of unit cell cannot be minimized. The 4F2 GAA structure has the advantages of a smaller area and a higher storage density. However, with the decreased size, there are a smaller distance between channel pillars and an increasingly obvious parasitic capacitance between conductive materials to affect performances of devices.

SUMMARY

An overview of the subject matter detailed in the present disclosure is provided below, which is not intended to limit the protection scope of the claims.

The present disclosure provides a semiconductor structure and a manufacturing method thereof.

According to a first aspect of the present disclosure, an embodiment provides a semiconductor structure, including:
 a base;
 a plurality of channel pillars perpendicularly provided on the base, the plurality of channel pillars being arranged in an array;
 a plurality of parallel BLs, each of the BLs wrapping lower parts of one column of the channel pillars; and
 a plurality of parallel WLs, each of the WLs wrapping upper parts of one row of the channel pillars, where the WLs and the BLs are perpendicular to each other on a same projection plane; and
 an insulating material layer is formed around the channel pillars below the BLs, between adjacent BLs, around the channel pillars between the BLs and the WLs, and between adjacent WLs; and gaps are formed in at least one of the insulating material layers.

According to a second aspect of the present disclosure, an embodiment provides a method of manufacturing a semiconductor structure, including:
 forming, on a semiconductor substrate, a plurality of channel pillars arranged in an array, recesses being formed around the channel pillars;
 forming a first insulating layer, the first insulating layer covering bottoms of the recesses;
 forming a plurality of BLs on an upper surface of the first insulating layer, each of the BLs wrapping lower parts of one column of the channel pillars;
 forming a second insulating layer, the second insulating layer filling recesses between the BLs and covering the BLs;
 forming a plurality of WLs on an upper surface of the second insulating layer, each of the WLs wrapping upper parts of one row of the channel pillars;
 partially or fully removing the second insulating layer and the first insulating layer; and
 forming gaps in at least one of isolation regions, the isolation regions being provided around the channel pillars below the BLs, between adjacent BLs, around the channel pillars between the BLs and the WLs, and between adjacent WLs.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

FIG. 1 illustrates a semiconductor structure according to an exemplary embodiment.

Figure 1A:
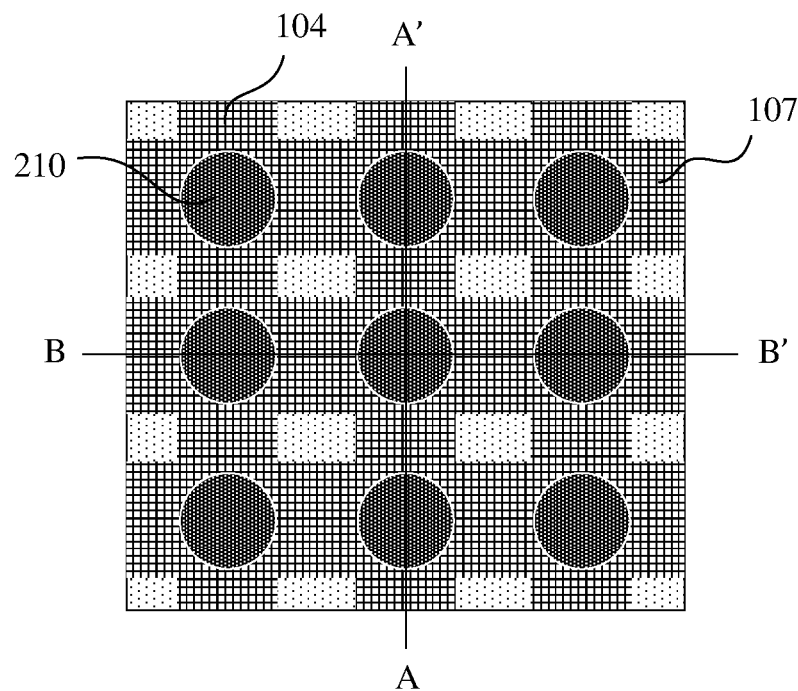
FIG. 1A is a schematic top view of a semiconductor structure according to an exemplary embodiment.
Figure 1B:
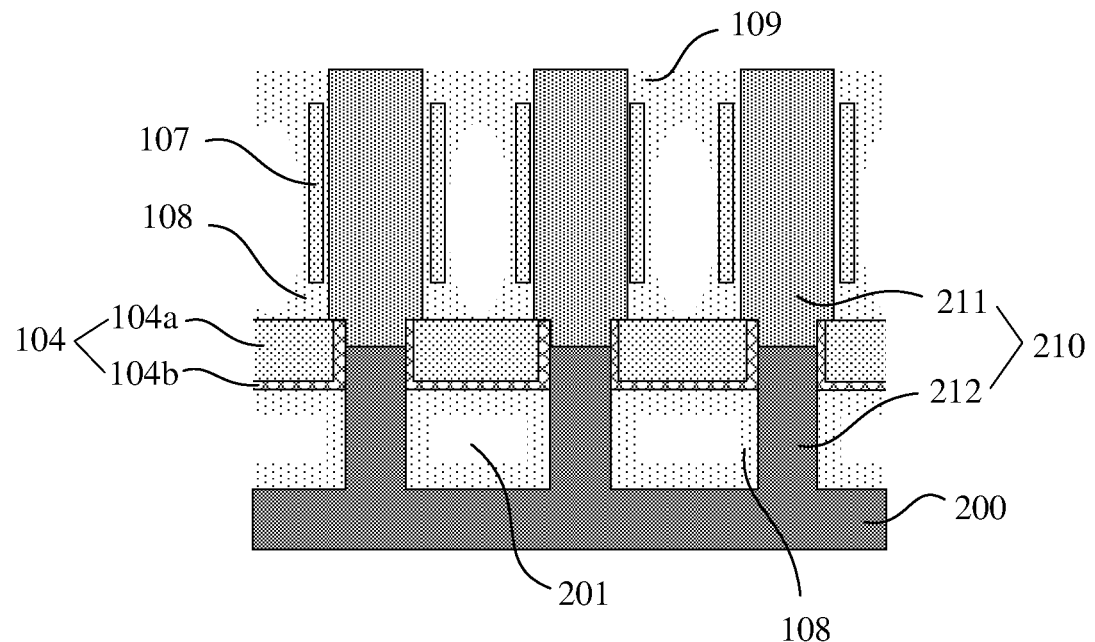
FIG. 1B is a cross-sectional view of FIG. 1A along an AA' direction.
Figure 1C:
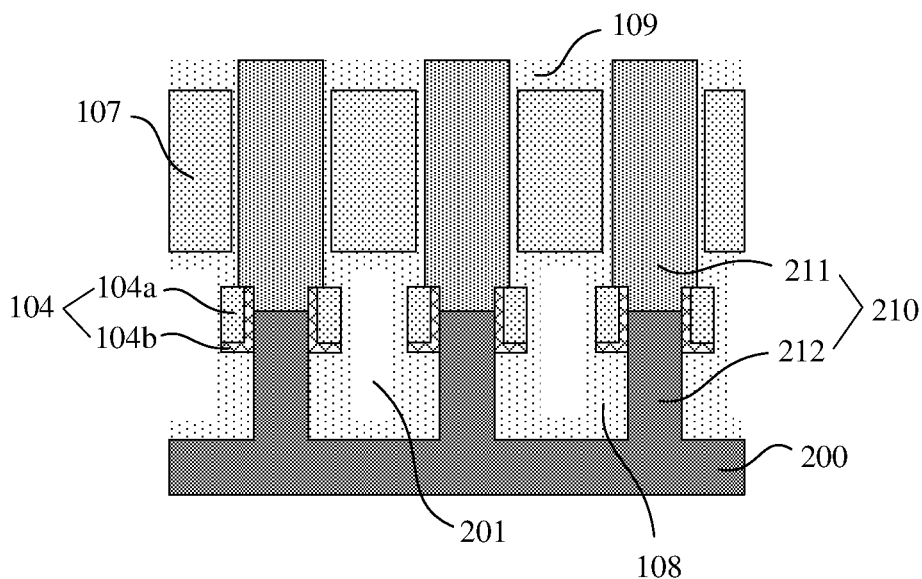
FIG. 1C is a cross-sectional view of FIG. 1A along a BB' direction.

Referring to FIGS. 1A-1C, the semiconductor structure includes: a base 200; a plurality of channel pillars 210 perpendicularly provided on the base 200, the plurality of channel pillars 210 being arranged in an array; a plurality of parallel BLs 104, each of the BLs 104 wrapping lower parts of one column of the channel pillars 210; and a plurality of parallel WLs 107, each of the WLs 107 wrapping upper parts of one row of the channel pillars 210. The WLs 107 and the BLs 104 are perpendicular to each other on a same projection plane.

An insulating material layers 108 is formed around the channel pillars 210 below the BLs 104, between adjacent BLs 104, around the channel pillars 210 between the BLs 104 and the WLs 107, and between adjacent WLs 107, separately. Gaps 201 are formed in at least one of the insulating material layers 108.

By forming the gaps at least between the adjacent BLs, around the pillars below the BLs, between the WLs or around the pillars below the WLs, the semiconductor structure in the embodiment of the present disclosure reduces the parasitic capacitances between conductive materials such as the WLs and the BLs to achieve better performance of the memory device.

According to the semiconductor structure provided in the present disclosure, the gaps may be formed in the insulating material layers at four different positions. In actual applications, there may be the following implementations.

Embodiment 1

The gaps 201 are only formed in the insulating material layer 108 between the adjacent WLs 107, but not in the insulating material layers 108 around the channel pillars 210 between the BLs 104 and the WLs 107, between the adjacent BLs 104, and around the channel pillars 210 below the BLs 104.

Embodiment 2

The gaps 201 are formed in the insulating material layers 108 between the adjacent WLs 107 and around the channel pillars 210 between the BLs 104 and the WLs 107, but not in the insulating material layers 108 between the adjacent BLs 104 and around the channel pillars 210 below the BLs 104.

Embodiment 3

The gaps 201 are formed in the insulating material layers 108 between the adjacent WLs 107, around the channel pillars 210 between the BLs 104 and the WLs 107, and between the adjacent BLs 104, but not in the insulating material layer 108 around the channel pillars 210 below the BLs 104.

Embodiment 4

The gaps 201 are formed in the insulating material layers 108 between the adjacent WLs 107, around the channel pillars 210 between the BLs 104 and the WLs 107, between the adjacent BLs 104, and around the channel pillars 210 below the BLs 104.

In some embodiments, the insulating material layers 108 cover surfaces of the channel pillars 210, the BLs 104 and the WLs 107. A closure layer 109 flush with the channel pillars 210 is filled around the channel pillars 210 above the WLs. The WLs 107 are junctionless transistors.

In some embodiments, the channel pillars 210 each include a first pillar body 211 and a second pillar body 212. The second pillar body 212 is perpendicularly provided on the base 200. The first pillar body 211 is provided at a top end of the second pillar body 212.

In some embodiments, the WLs 107 are provided on middle parts of the first pillar bodies 211.

The BLs 104 are provided at junctions between the first pillar bodies 211 and the second pillar bodies 212. The BLs 104 wrap bottom ends of the first pillar bodies 211 and the top ends of the second pillar bodies 212. Heights of parts of the first pillar bodies 211 wrapped by the BLs 104 are less than half of heights of the BLs 104.

In some embodiments, gate oxide layers are provided between the first pillar bodies 211 and the WLs 107.

In some embodiments, the base 200 and the second pillar bodies 212 are made of a P-type semiconductor material, and the first pillar bodies 211 are made of an N-type semiconductor material.

In some embodiments, the BLs 104 and the WLs 107 are made of a metal material, and the closure layer 109 is made of an insulating oxide material.

The embodiment of the present disclosure provides the GAA memory structure with the BLs wrapping the channel pillars. Wrap-around BL structures are formed on bottoms of the channel pillars with a WL formation process. The WL structures are the junctionless transistors. The heights of the parts of the channel pillars wrapped by the BLs are less than half of the heights of the BLs. The gaps are formed between the adjacent BLs, around the pillars below the BLs, between the WLs and around the pillars below the WLs to take the desirable isolation effect, thus reducing the parasitic capacitances between the WLs.

Figure 2:
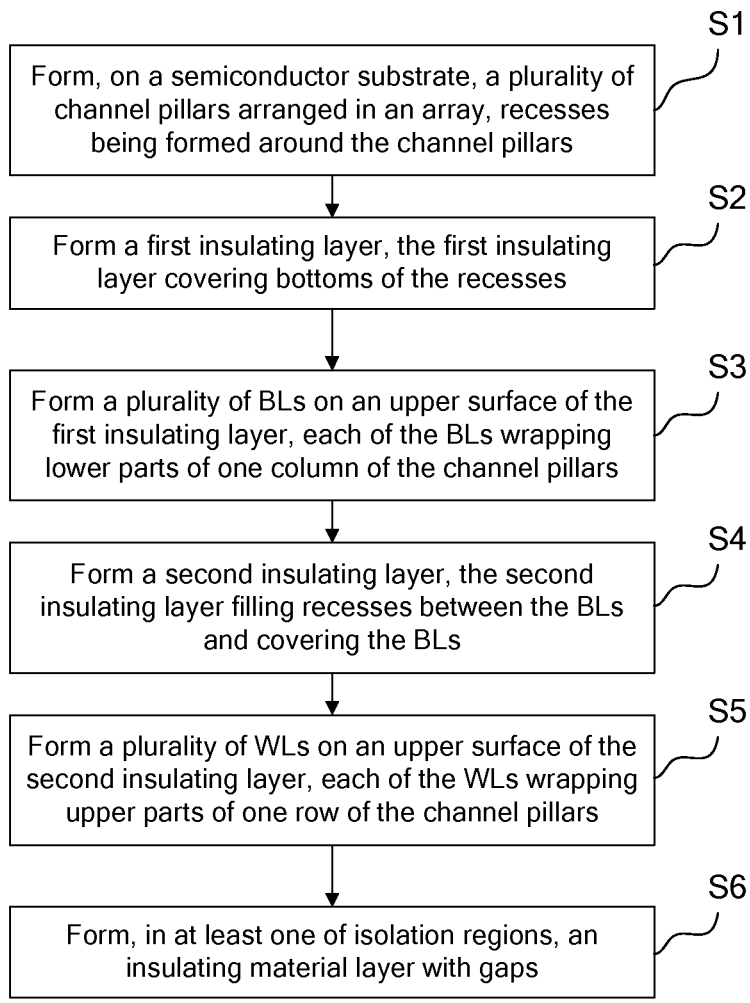
FIG. 2 is a flowchart of a method of manufacturing a semiconductor structure according to an exemplary embodiment.

FIG. 2 is a flowchart of a method of manufacturing a semiconductor structure according to an exemplary embodiment. The method of manufacturing a semiconductor structure includes:

Step S1: Form, on a semiconductor substrate, a plurality of channel pillars arranged in an array, recesses being formed around the channel pillars.

Step S2: Form a first insulating layer, the first insulating layer covering bottoms of the recesses.

Step S3: Form a plurality of BLs on an upper surface of the first insulating layer, each of the BLs wrapping lower parts of one column of the channel pillars.

Step S4: Form a second insulating layer, the second insulating layer filling recesses between the BLs and covering the BLs.

Step S5: Form a plurality of WLs on an upper surface of the second insulating layer, each of the WLs wrapping upper parts of one row of the channel pillars.

Step S6: Form, in at least one of isolation regions, an insulating material layer with gaps, the isolation regions being provided around the channel pillars below the BLs, between adjacent BLs, around the channel pillars between the BLs and the WLs, and between adjacent WLs.

By forming the gaps at least between the adjacent BLs, around the pillars below the BLs, between the WLs or around the pillars below the WLs, the semiconductor structure in the embodiment of the present disclosure reduces the parasitic capacitances between conductive materials such as the WLs and the BLs to achieve better performance of the memory device.

FIGS. 3-12 are schematic structural diagrams corresponding to various steps of a method of manufacturing a semiconductor structure according to an embodiment of the present disclosure. The method of manufacturing a semiconductor structure provided by the embodiment of the present disclosure will be further described below in detail with reference to FIGS. 3-12.

Step S1: Form, on a semiconductor substrate, a plurality of channel pillars arranged in an array, recesses being formed around the channel pillars.

Figure 3:
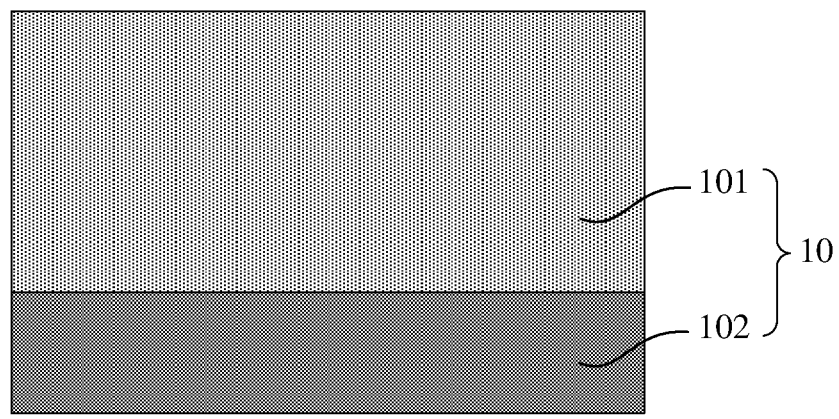
FIGS. 3, 4A, 4B, 5A, 5B, 6A, 6B, 7A, 7B, 8A, 8B, 9A-9C, 10A-10C, 11A-11C, 12A-12C are schematic structural diagrams corresponding to various steps of a method of manufacturing a semiconductor structure according to an embodiment of the present disclosure.

In some embodiments, Step S1 may include:

Step S101: Provide the semiconductor substrate 10, as shown in FIG. 3.

Step S102: Implant ions into the semiconductor substrate 10 to form a laminated structure for an N-type substrate 101 and a P-type substrate 102.

Figure 4A:
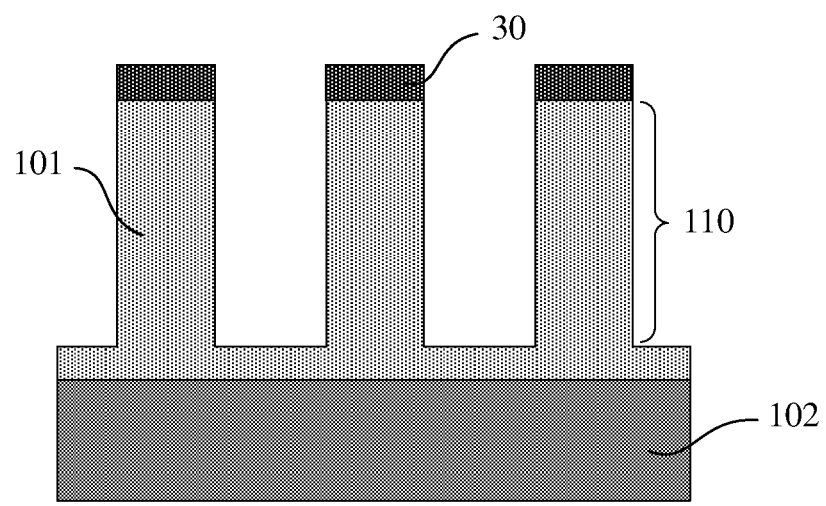
Figure 4B:
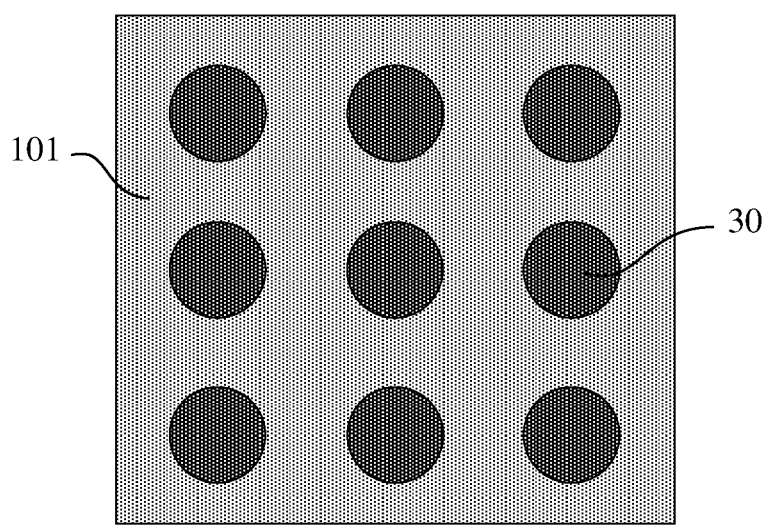

Step S103: Form pillar masks 30 on a surface of the N-type substrate 101, as shown in FIG. 4B.

Step S104: Etch, with the pillar masks 30 as masks, the N-type substrate 101 to form first cylindrical bodies 110, as shown in FIG. 4A. Bottoms of the first cylindrical bodies 110 are higher than a bottom of the N-type substrate 101.

Step S105: Etch, with the pillar masks 30 as the masks, a remaining part of the N-type substrate 101 and a part of the P-type substrate 102 to form second cylindrical bodies 120, as shown in FIGS. 5A-5B.

Figure 5A:
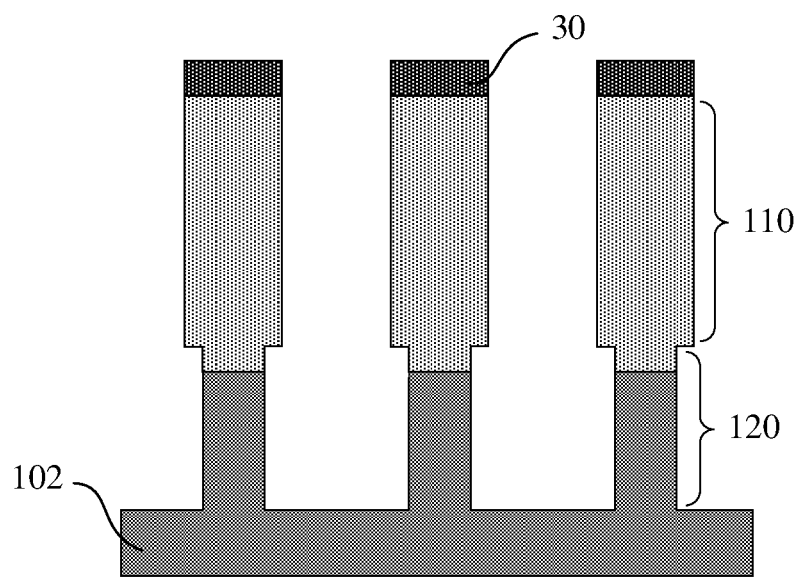
Figure 5B:
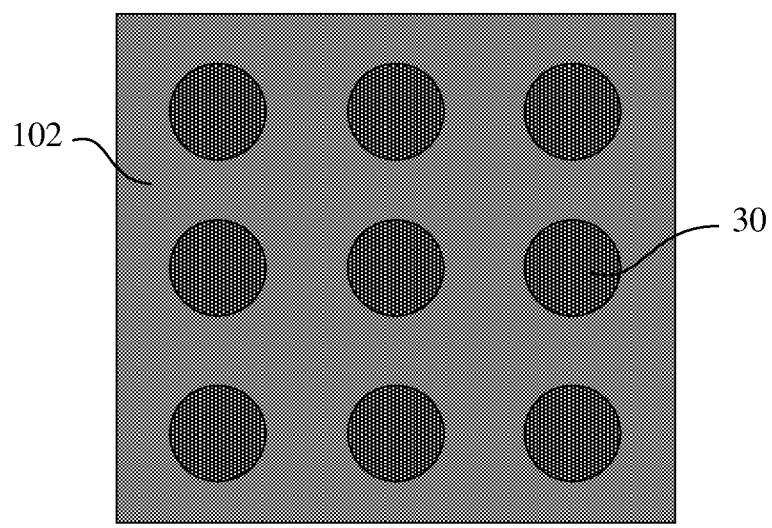

As can be seen from FIG. 5A, the channel pillars each include a first cylindrical body 110 and a second cylindrical body 120. In terms of the height, the first cylindrical body 110 is a part of the N-type substrate 101, and the second cylindrical body 120 is formed by a remaining part of the N-type substrate 101 and a part of the P-type substrate 102.

Step S2: Form a first insulating layer, the first insulating layer covering bottoms of the recesses.

Figure 6A:
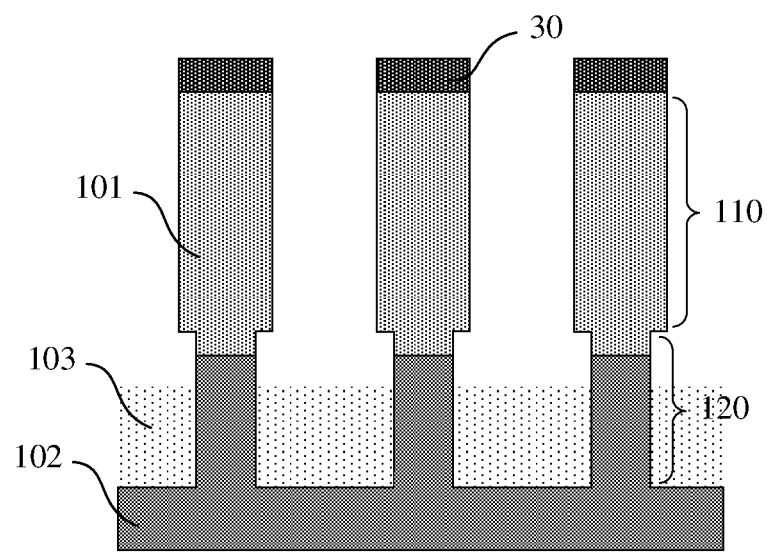
Figure 6B:
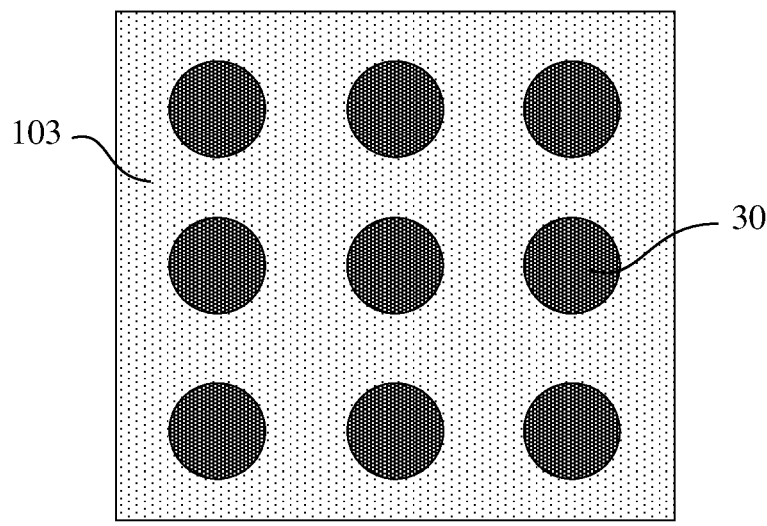

In some embodiments, as shown in FIGS. 6A-6B, Step S2 may include:

Step S201: Deposit an insulating material around the second cylindrical bodies 120 to form the first insulating layer 103. A top of the first insulating layer 103 is lower than a top of the P-type substrate 102.

Step S3: Form a plurality of BLs on an upper surface of the first insulating layer, each of the BLs wrapping lower parts of one column of the channel pillars.

Figure 7A:
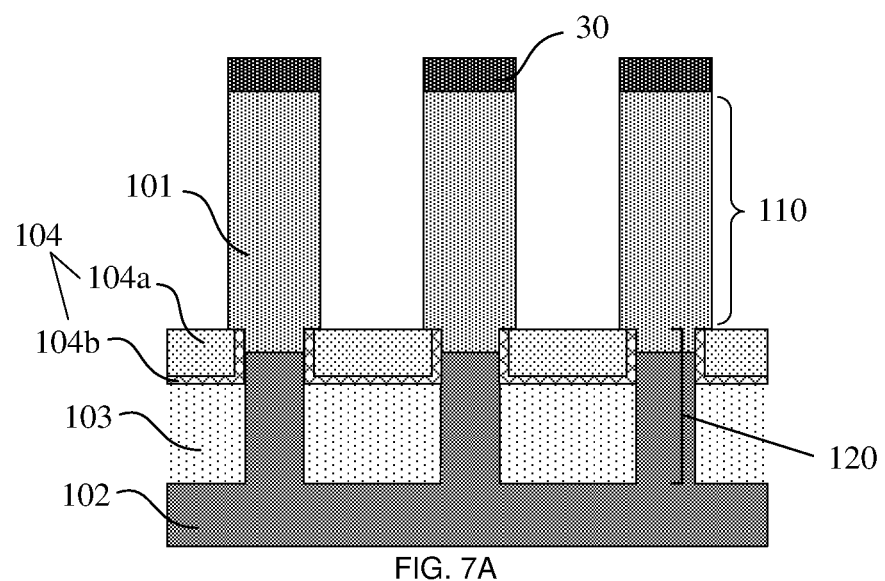
Figure 7B:
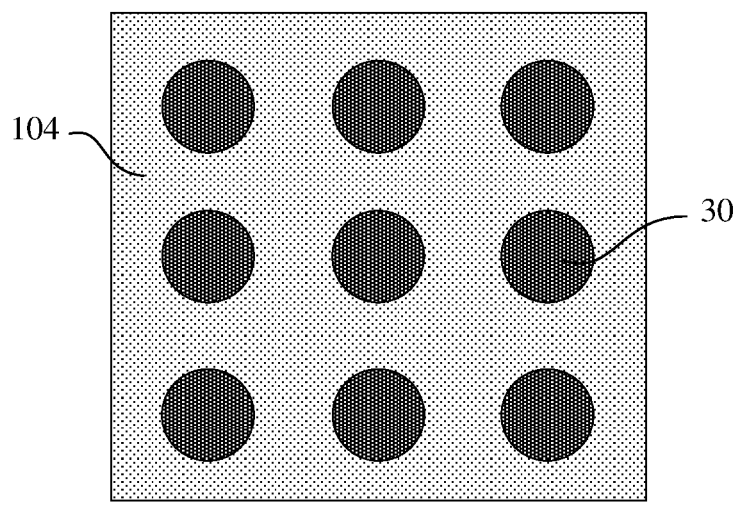

In some embodiments, Step S3 may include:

Step S301: Deposit a BL material layer 104 on the upper surface of the first insulating layer 103, as shown in FIG. 7A-7B. A top of the BL material layer 104 is higher than the top of the P-type substrate 102.

Figure 8A:
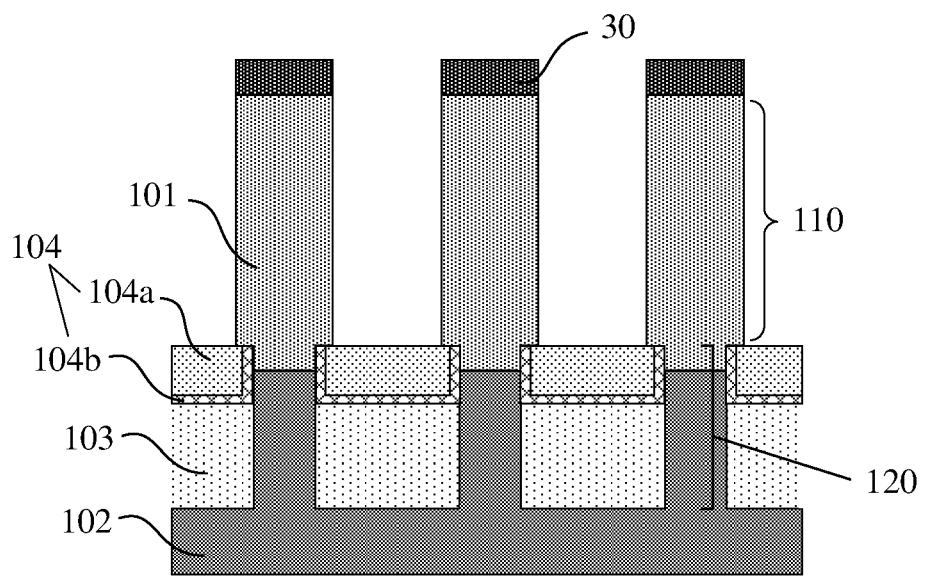
Figure 8B:
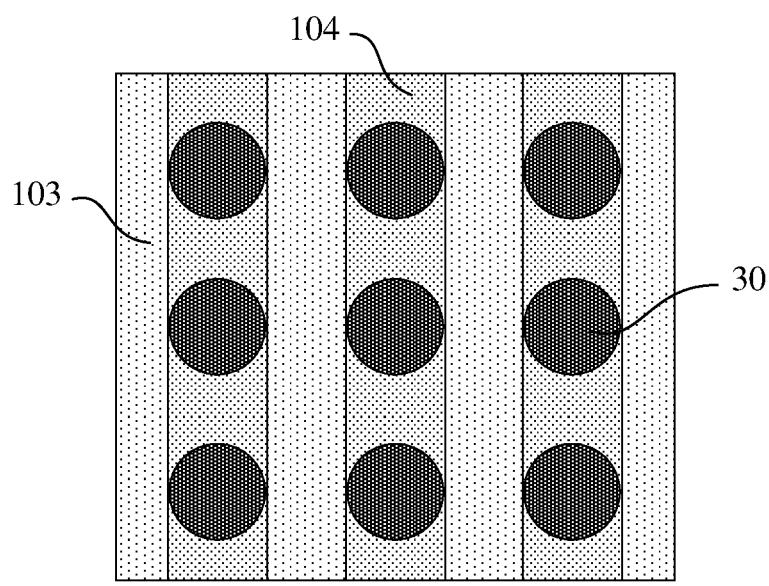

Step S302: Pattern and etch the BL material layer 104 to form the strip-shaped BLs 104, as shown in FIGS. 8A-8B.

The BLs 104 each may include a plurality of layers, such as a first BL material 104a and a second BL material 104b. The first BL material 104a may be titanium nitride (TiN), while the second BL material 104b may be tungsten (W).

In some embodiments, Step S3 may also include:

Step S301: Deposit a BL material layer on the upper surface of the first insulating layer 103. A top of the BL material layer is higher than the top of the P-type substrate 102.

Step S302: Etch back the BL material layer, such that a height of a part of the N-type substrate 101 wrapped by the BL material layer is less than half of a height of the BL material layer.

Step S303: Pattern and etch the BL material layer to form the strip-shaped BLs 104.

Step S4: Form a second insulating layer, the second insulating layer filling recesses between the BLs and covering the BLs.

Figure 9A:
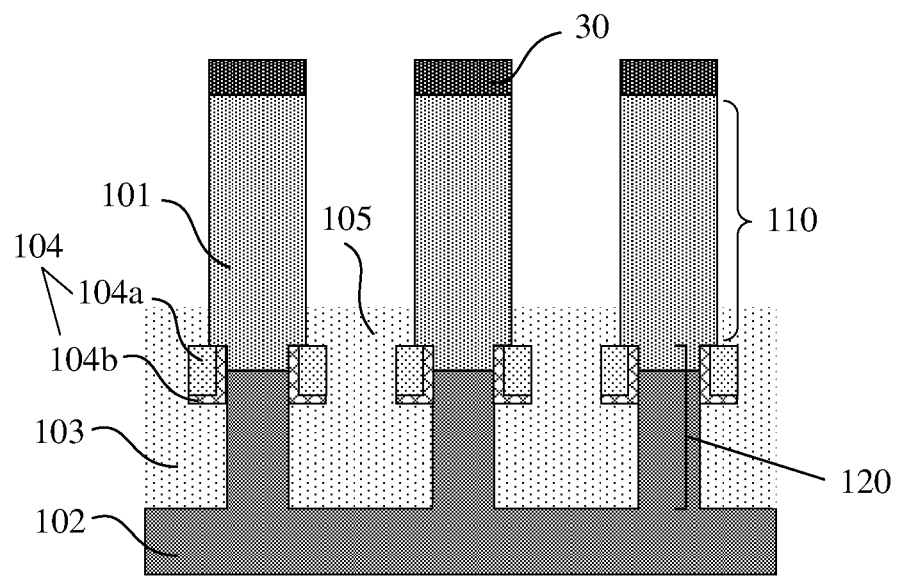
Figure 9B:
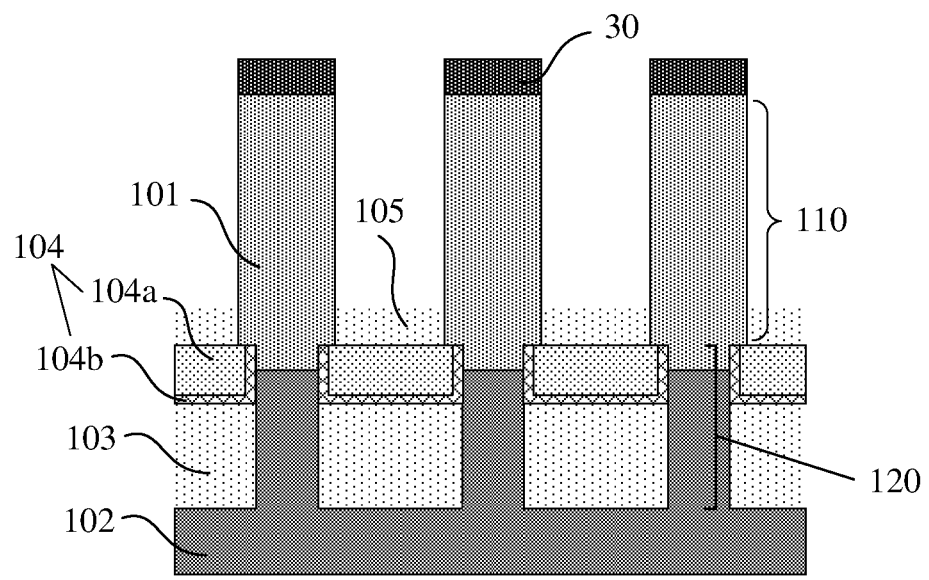
Figure 9C:
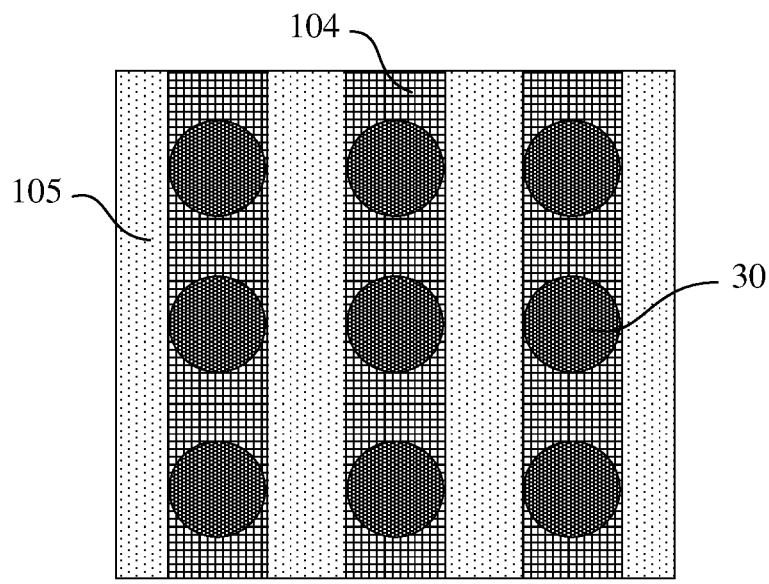

In some embodiments, as shown in FIGS. 9A-9C, Step S4 of forming a second insulating layer may include:

Step S401: Deposit an insulating material to fill the recesses between the BLs 104 and cover the BLs 104.

Step S402: Planarize the insulating material to form the second insulating layer 105.

In some embodiments, before Step S5, the method of manufacturing a semiconductor structure may further include:

Step S501: Form gate oxide layers on sidewalls of the first cylindrical bodies 110, such that the gate oxide layers wrap the first cylindrical bodies 110.

Step S5: Form a plurality of WLs on an upper surface of the second insulating layer, each of the WLs wrapping upper parts of one row of the channel pillars.

Figure 10A:
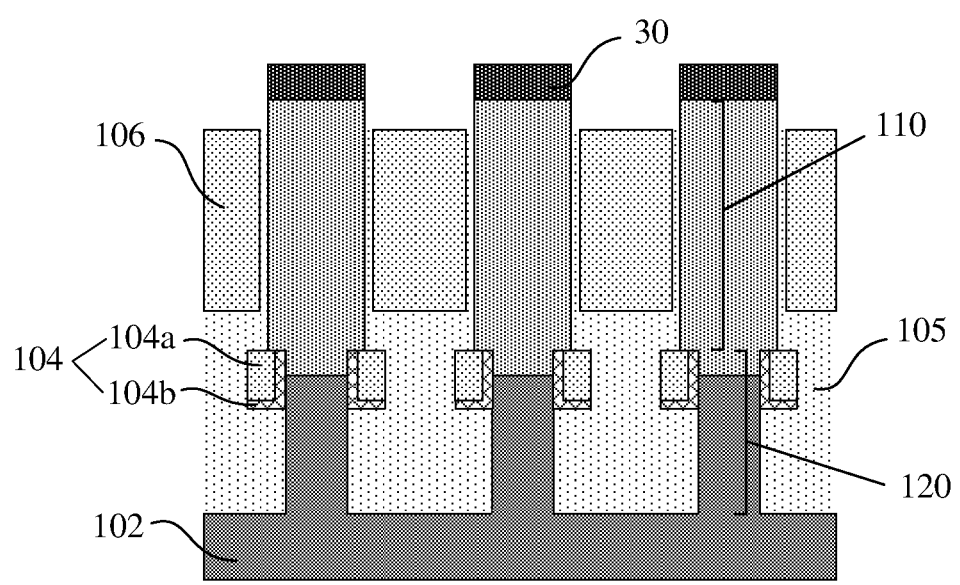
Figure 10B:
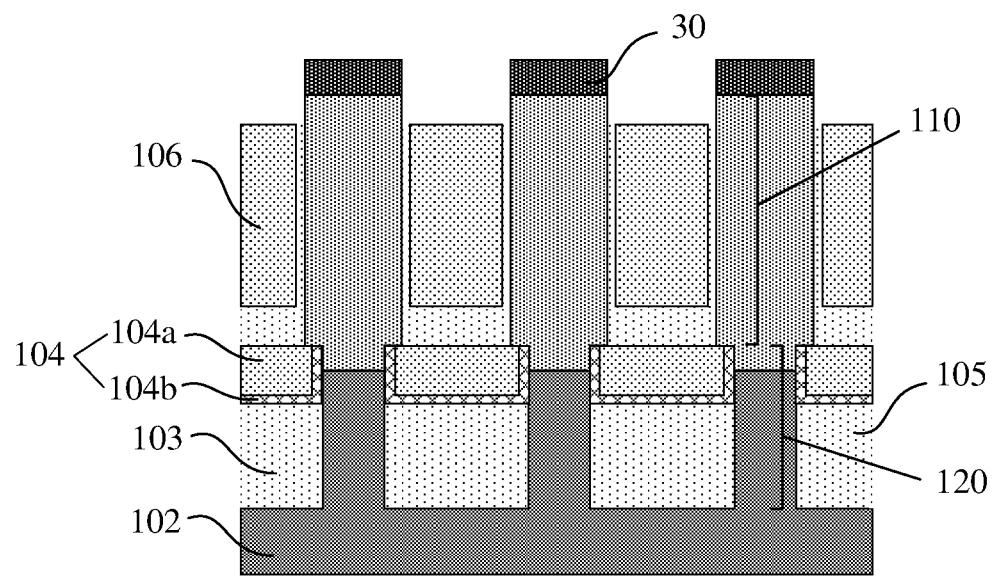
Figure 10C:
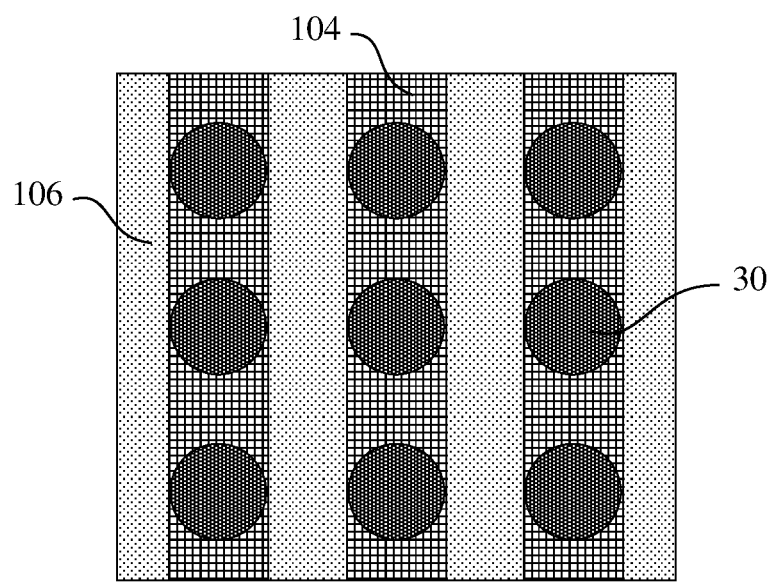

In some embodiments, Step S5 may include:

Step S502: Deposit a WL material layer 106 around the gate oxide layers, as shown in FIGS. 10A-10C.

Step S503: Etch back the WL material layer 106, such that a top of the WL material layer 106 is lower than the top of the N-type substrate 101, namely the top of the WL material layer 106 is lower than tops of the first cylindrical bodies 110.

Figure 11A:
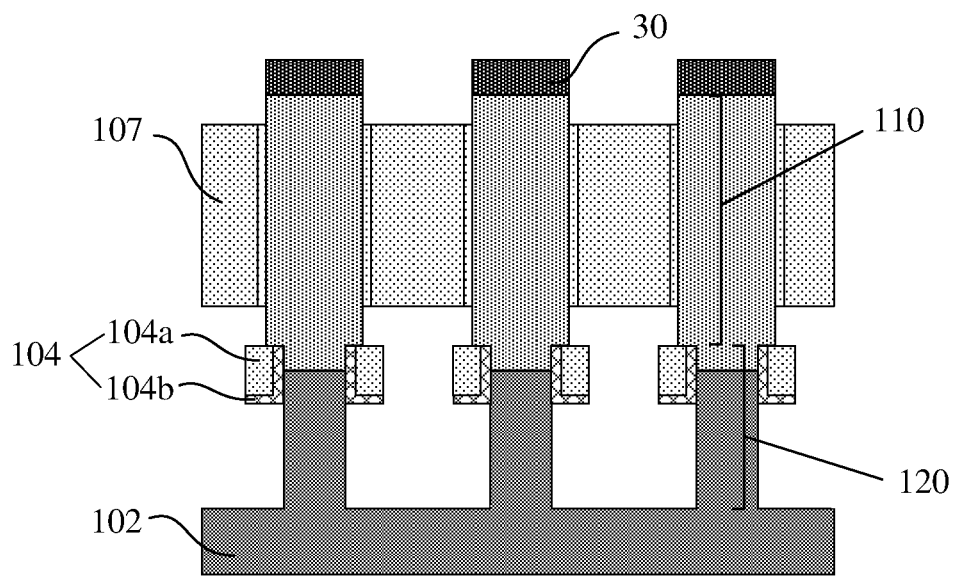
Figure 11B:
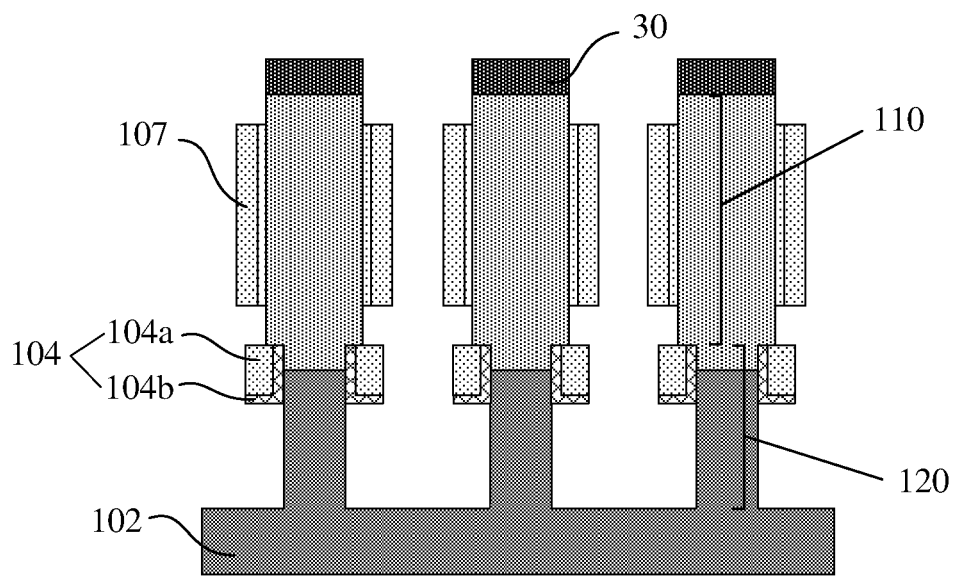
Figure 11C:
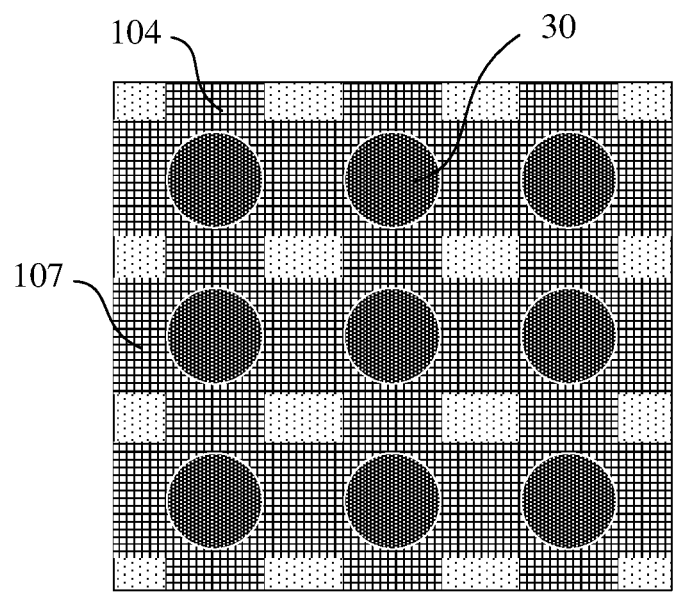

Step S504: Pattern and etch the WL material layer 106 to form the strip-shaped WLs 107, as shown in FIGS. 10C and FIG. 11.

Step S6: Form, in at least one of isolation regions, an insulating material layer with gaps, the isolation regions being provided around the channel pillars below the BLs, between adjacent BLs, around the channel pillars between the BLs and the WLs, and between adjacent WLs.

It is to be noted that Step S6 may be implemented in four different manners, and the embodiments are sequentially described below in detail.

In some embodiments, Step S6 may include:

Step S601a: Deposit an oxide isolation material on exposed surfaces of the WLs to form an insulating material layer.

Step S602a: Fill an oxide isolation material around the first cylindrical bodies above the WLs to form a closure layer.

Step S603a: Form gaps between the adjacent WLs below the closure layer.

In some embodiments, Step S6 may also include:

Step S601b: Partially remove the second insulating layer.

Step S602b: Deposit an oxide isolation material on exposed surfaces of the WLs to form an insulating material layer.

Step S603b: Fill an oxide isolation material around the first cylindrical bodies above the WLs to form a closure layer.

Step S604b: Form gaps between the adjacent WLs and around the channel pillars between the BLs and the WLs.

In some embodiments, Step S6 may also include:

Step S601c: Remove the second insulating layer.

Step S602c: Deposit an oxide isolation material on exposed surfaces of the WLs and exposed surfaces of the BLs to form insulating material layers.

Step S603c: Fill an oxide isolation material around the first cylindrical bodies above the WLs to form a closure layer.

Step S604c: Form gaps between the adjacent WLs, around the channel pillars between the BLs and the WLs, and between the adjacent BLs.

In some embodiments, Step S6 may also include:

Step S601d: Remove the second insulating layer 105 and the first insulating layer 103 (referring to FIG. 10B).

Figure 12A:
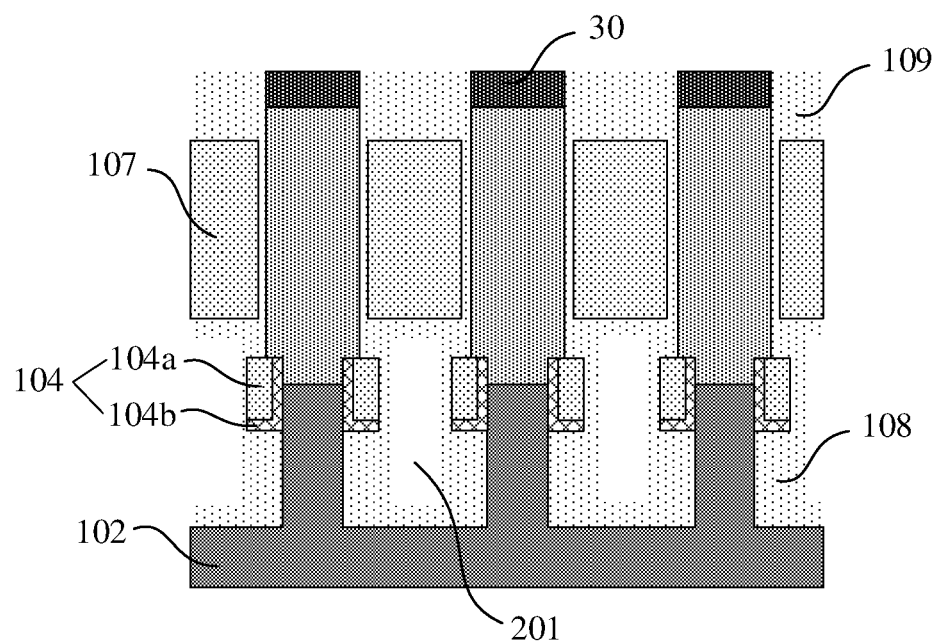
Figure 12B:
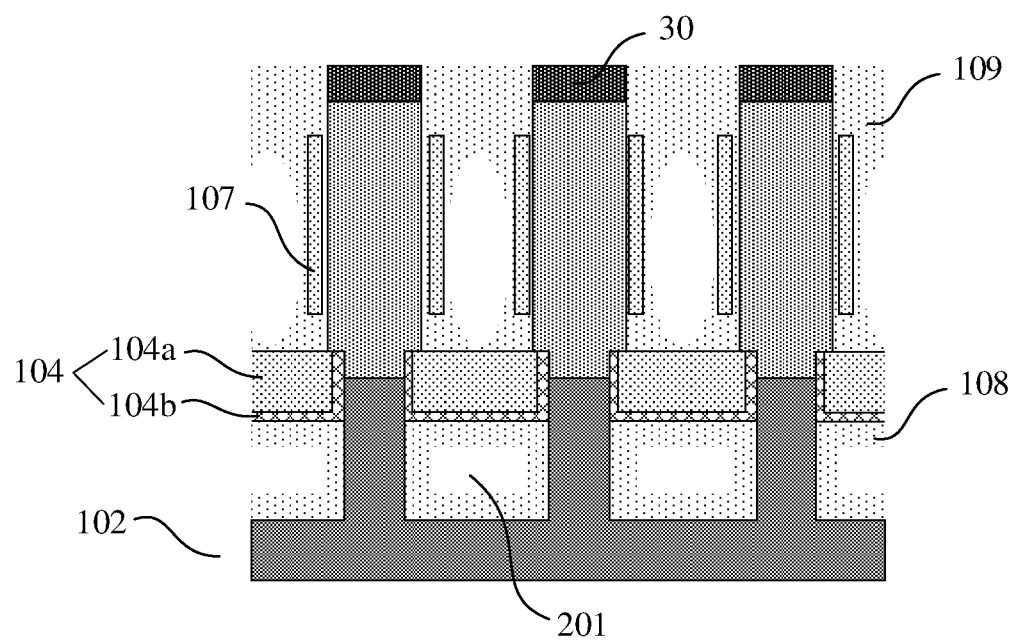
Figure 12C:
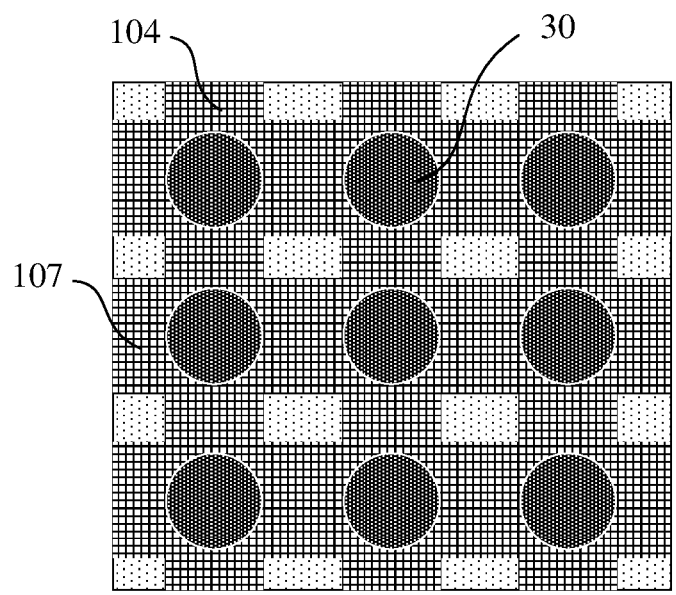

Step S602d: Deposit an oxide isolation material on exposed surfaces of the WLs 107 and exposed surfaces of the BLs 104 to form insulating material layers 108, as shown in FIGS. 12A-12C.

Step S603d: Fill an oxide isolation material around the first cylindrical bodies 110 (as shown in FIG. 11B) above the WLs 107 to form a closure layer 109.

Step S604d: Form gaps 201 between the adjacent WLs, around the channel pillars between the BLs and the WLs, between the adjacent BLs, and around the channel pillars below the BLs.

In some embodiments, after the closure layer is formed, the method of manufacturing a semiconductor structure may further include:

Step S701: Remove the pillar masks 30 and a part of the closure layer 109, such that an upper surface of a remaining part of the closure layer 109 is flush with upper surfaces of the first cylindrical bodies 110, as shown in FIG. 12A.

Step S702: Connect back-end capacitors to the upper surfaces of the first cylindrical bodies 110 (as shown in FIG. 11B).

The semiconductor structure shown in FIG. 1 is obtained through the foregoing steps.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more embodiments or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

By forming the gaps at least between the adjacent BLs, around the pillars below the BLs, between the WLs or around the pillars below the WLs, the semiconductor structure and the manufacturing method thereof provided by the embodiments of the present disclosure reduce the parasitic capacitances between conductive materials such as the WLs and the BLs to achieve better performance of the memory device.

The invention claimed is:

1. A semiconductor structure, comprising:
a base;
a plurality of channel pillars perpendicularly provided on the base, the plurality of channel pillars being arranged in an array;
a plurality of parallel bit lines, each of the bit lines wrapping lower parts of one column of the channel pillars;
a plurality of parallel word lines, each of the word lines wrapping upper parts of one row of the channel pillars, wherein the word lines and the bit lines are perpendicular to each other on a same projection plane; and
an insulating material layer is formed around the channel pillars below the bit lines, between adjacent bit lines, around the channel pillars between the bit lines and the word lines, and between adjacent word lines, separately; and gaps are formed in at least one of the insulating material layers;
wherein each of the plurality of channel pillars comprise a first pillar body and a second pillar body; the second pillar body is perpendicularly provided on the base; and the first pillar body is provided at a top end of the second pillar body;
wherein the base and the second pillar bodies are made of a P-type semiconductor material, and the first pillar bodies are made of an N-type semiconductor material;
wherein the semiconductor structure is manufactured by a method comprising:
forming, on a semiconductor substrate, the plurality of channel pillars arranged in an array, recesses being formed around the channel pillars;
forming a first insulating layer, the first insulating layer covering bottoms of the recesses;

forming a plurality of bit lines on an upper surface of the first insulating layer, each of the bit lines wrapping lower parts of one column of the channel pillars;
forming a second insulating layer, the second insulating layer filling recesses between the bit lines and covering the bit lines;
forming a plurality of word lines on an upper surface of the second insulating layer, each of the word lines wrapping upper parts of one row of the channel pillars; and
forming, in at least one of isolation regions, the insulating material layer with gaps, the isolation regions being provided around the channel pillars below the bit lines, between adjacent bit lines, around the channel pillars between the bit lines and the word lines, and between adjacent word lines;
wherein the forming, on a semiconductor substrate, a plurality of channel pillars arranged in an array comprises:
providing the semiconductor substrate;
implanting ions into the semiconductor substrate to form a laminated structure for an N-type substrate and a P-type substrate;
forming pillar masks on a surface of the N-type substrate;
etching, with the pillar masks as masks, the N-type substrate to form first cylindrical bodies, bottoms of the first cylindrical bodies being higher than a bottom of the N-type substrate; and
etching, with the pillar masks as the masks, a remaining part of the N-type substrate and a part of the P-type substrate to form second cylindrical bodies.

2. The semiconductor structure according to claim 1, wherein the insulating material layers cover surfaces of the channel pillars, the bit lines and the word lines; and
a closure layer flush with the channel pillars is filled around the channel pillars above the word lines.

3. The semiconductor structure according to claim 1, wherein the word lines are provided on middle parts of the first pillar bodies; and
the bit lines are provided at junctions between the first pillar bodies and the second pillar bodies; the bit lines wrap bottom ends of the first pillar bodies and the top ends of the second pillar bodies; and heights of parts of the first pillar bodies wrapped by the bit lines are less than half of heights of the bit lines.

4. The semiconductor structure according to claim 3, wherein gate oxide layers are provided between the first pillar bodies and the word lines.

5. The semiconductor structure according to claim 2, wherein the bit lines and the word lines are made of a metal material; and the closure layer is made of an insulating oxide material.

6. A method of manufacturing a semiconductor structure, comprising:
forming, on a semiconductor substrate, a plurality of channel pillars arranged in an array, recesses being formed around the channel pillars;
forming a first insulating layer, the first insulating layer covering bottoms of the recesses;
forming a plurality of bit lines on an upper surface of the first insulating layer, each of the bit lines wrapping lower parts of one column of the channel pillars;
forming a second insulating layer, the second insulating layer filling recesses between the bit lines and covering the bit lines;
forming a plurality of word lines on an upper surface of the second insulating layer, each of the word lines wrapping upper parts of one row of the channel pillars; and
forming, in at least one of isolation regions, an insulating material layer with gaps, the isolation regions being provided around the channel pillars below the bit lines, between adjacent bit lines, around the channel pillars between the bit lines and the word lines, and between adjacent word lines;
wherein the forming, on a semiconductor substrate, a plurality of channel pillars arranged in an array comprises:
providing the semiconductor substrate;
implanting ions into the semiconductor substrate to form a laminated structure for an N-type substrate and a P-type substrate;
forming pillar masks on a surface of the N-type substrate;
etching, with the pillar masks as masks, the N-type substrate to form first cylindrical bodies, bottoms of the first cylindrical bodies being higher than a bottom of the N-type substrate; and
etching, with the pillar masks as the masks, a remaining part of the N-type substrate and a part of the P-type substrate to form second cylindrical bodies.

7. The method according to claim 6, wherein the forming a first insulating layer comprises:
depositing an insulating material around the second cylindrical bodies, a top of the first insulating layer being lower than a top of the P-type substrate.

8. The method according to claim 7, wherein the forming a plurality of bit lines on an upper surface of the first insulating layer comprises:
depositing a bit line material layer on the upper surface of the first insulating layer, a top of the bit line material layer being higher than the top of the P-type substrate; and
patterning and etching the bit line material layer, and forming the strip-shaped bit lines.

9. The method according to claim 8, before the patterning and etching the bit line material layer, further comprising:
etching back the bit line material layer, such that a height of a part of the N-type substrate wrapped by the bit line material layer is less than half of a height of the bit line material layer.

10. The method according to claim 6, wherein the forming a second insulating layer comprises:
depositing an insulating material to fill the recesses between the bit lines and cover the bit lines; and
planarizing the insulating material to form the second insulating layer.

11. The method according to claim 6, before the forming a plurality of word lines on an upper surface of the second insulating layer, further comprising:
forming gate oxide layers on sidewalls of the first cylindrical bodies, such that the gate oxide layers wrap the first cylindrical bodies.

12. The method according to claim 11, wherein the forming a plurality of word lines on an upper surface of the second insulating layer comprises:
depositing a word line material layer around the gate oxide layers;
etching back the word line material layer, such that a top of the word line material layer is lower than the top of the N-type substrate; and
patterning and etching the word line material layer, and forming the strip-shaped word lines.

13. The method according to claim 10, wherein the forming, in at least one of isolation regions, an insulating material layer with gaps comprises:
- depositing an oxide isolation material on exposed surfaces of the word lines, and forming an insulating material layer;
- filling the oxide isolation material around the first cylindrical bodies above the word lines, and forming a closure layer; and
- forming gaps between the adjacent word lines below the closure layer.

14. The method according to claim 10, wherein the forming, in at least one of isolation regions, an insulating material layer with gaps comprises:
- partially removing the second insulating layer;
- depositing an oxide isolation material on exposed surfaces of the word lines, and forming an insulating material layer;
- filling the oxide isolation material around the first cylindrical bodies above the word lines, and forming a closure layer; and
- forming gaps between the adjacent word lines and around the channel pillars between the bit lines and the word lines.

15. The method according to claim 10, wherein the forming, in at least one of isolation regions, an insulating material layer with gaps comprises:
- removing the second insulating layer;
- depositing an oxide isolation material on exposed surfaces of the word lines and exposed surfaces of the bit lines, and forming insulating material layers;
- filling the oxide isolation material around the first cylindrical bodies above the word lines, and forming a closure layer; and
- forming gaps between the adjacent word lines, around the channel pillars between the bit lines and the word lines, and between the adjacent bit lines.

16. The method according to claim 10, wherein the forming, in at least one of isolation regions, an insulating material layer with gaps comprises:
- removing the second insulating layer and the first insulating layer;
- depositing an oxide isolation material on exposed surfaces of the word lines and exposed surfaces of the bit lines, and forming insulating material layers;
- filling the oxide isolation material around the first cylindrical bodies above the word lines, and forming a closure layer; and
- forming gaps between the adjacent word lines, around the channel pillars between the bit lines and the word lines, between the adjacent bit lines, and around the channel pillars below the bit lines.

17. The method according to claim 13, after the closure layer is formed, further comprising:
- removing the pillar masks and a part of the closure layer, such that an upper surface of a remaining part of the closure layer is flush with upper surfaces of the first cylindrical bodies; and
- connecting back-end capacitors to the upper surfaces of the first cylindrical bodies.

* * * * *